(12) United States Patent
Sakashita et al.

(10) Patent No.: US 11,313,029 B2
(45) Date of Patent: Apr. 26, 2022

(54) POTASSIUM SODIUM NIOBATE SPUTTERING TARGET

(71) Applicant: JX Nippon Mining & Metals Corporation, Tokyo (JP)

(72) Inventors: Ryosuke Sakashita, Ibaraki (JP); Yoshitaka Shibuya, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 16/842,896

(22) Filed: Apr. 8, 2020

(65) Prior Publication Data

US 2020/0340096 A1 Oct. 29, 2020

(30) Foreign Application Priority Data

Apr. 26, 2019 (JP) .............................. JP2019-085350
Sep. 12, 2019 (JP) .............................. JP2019-166017

(51) Int. Cl.
| | | |
|---|---|---|
| *H01J 37/34* | (2006.01) | |
| *C23C 14/08* | (2006.01) | |
| *C23C 14/34* | (2006.01) | |
| *H01L 41/187* | (2006.01) | |
| *H01L 41/316* | (2013.01) | |

(52) U.S. Cl.
CPC ........ *C23C 14/088* (2013.01); *C23C 14/3407* (2013.01); *H01J 37/3426* (2013.01); *H01L 41/1873* (2013.01); *H01L 41/316* (2013.01)

(58) Field of Classification Search
None
See application file for complete search history.

(56) References Cited

U.S. PATENT DOCUMENTS

| | | | |
|---|---|---|---|
| 2008/0274351 A1 | 11/2008 | Itoh et al. | |
| 2009/0139859 A1 | 6/2009 | Takami et al. | |
| 2013/0009519 A1* | 1/2013 | Shibata | ............... H01L 41/1873 310/348 |
| 2015/0064804 A1 | 3/2015 | Horikiri et al. | |
| 2016/0376696 A1* | 12/2016 | Kiuchi | ................ C23C 14/3414 204/298.13 |
| 2017/0288127 A1* | 10/2017 | Azuma | .................... H01L 41/18 |
| 2017/0288128 A1 | 10/2017 | Azuma et al. | |
| 2017/0309460 A1 | 10/2017 | Narita | |
| 2018/0105421 A1* | 4/2018 | Polcik | ..................... C01B 32/05 |
| 2018/0301618 A1 | 10/2018 | Shibata et al. | |

FOREIGN PATENT DOCUMENTS

| | | |
|---|---|---|
| EP | 3364471 A1 | 8/2018 |
| JP | H08-246139 A | 9/1996 |
| JP | 2002-338354 A | 11/2002 |
| JP | 2004-059965 A | 2/2004 |
| JP | 2005-133105 A | 5/2005 |
| JP | 2012-195074 A | 10/2012 |
| JP | 2014-033210 A | 2/2014 |
| JP | 2014-129231 A | 7/2014 |
| JP | 2017-076730 A | 4/2017 |
| JP | 2017-179415 A | 10/2017 |
| JP | 2018-186287 A | 11/2018 |
| WO | 2006/134694 A1 | 12/2006 |
| WO | 2016/056352 A1 | 4/2016 |

OTHER PUBLICATIONS

Bahanurddin Nor Fatin Khairah et al., "Effect of Different Compaction Pressure and Different Sintering Route on K0.5Na0.5NbO3 Physical and Dielectric Properties", Ceramics-Silikaty, 60 (3), pp. 220-225, 2016 (month unknown).
Extended European Search Report, issued for counterpart European Patent No. 20163339.3, dated Oct. 22, 2020.
Japanese Office Action, issued for counterpart Japanese Patent Application No. 2019-166017, dated Nov. 26, 2019.

* cited by examiner

*Primary Examiner* — Jason Berman
(74) *Attorney, Agent, or Firm* — Howson & Howson LLP

(57) ABSTRACT

A sputtering target formed from a potassium sodium niobate sintered body to which a dopant has been added; as a dopant, the sputtering target includes one or more types among Li, Mg, Ca, Sr, Ba, Bi, Sb, V, In, Ta, Mo, W, Cr, Ti, Zr, Hf, Sc, Y, La, Ce, Pr, Nd, Sm, Eu, Gd, Tb, Dy, Ho, Er, Tm, Yb, Lu, Cu, Zn, Ag, Mn, Fe, Co, Ni, Al, Si, Ge, Sn, and Ga; and a variation coefficient of a dopant concentration in a plane of the sputtering target is 0.12 or less. In terms of suppressing the generation of particles, provided is a sputtering target which is formed from a sintered body that includes potassium sodium niobate and to which a dopant has been added.

18 Claims, No Drawings

POTASSIUM SODIUM NIOBATE SPUTTERING TARGET

BACKGROUND

The disclosure relates to a potassium sodium niobate sputtering target.

Lead-based lead zirconate titanate (abbreviated as PZT hereinafter), which exhibits superior piezoelectric properties, is being used as the piezoelectric element for use in sensors and actuators. While PZT exhibits piezoelectric properties that are favorable and stable, the environmental burden is high due to the inclusion of lead, of which use is particularly restricted in Europe under such directives as the Hazardous Substances (RoHS) and the End-of Life Vehicles Directive (ELV). The challenge is to replace it with a non-lead-based (lead-free) substance as the piezoelectric material.

While various materials are studied as substitute substance, it is not easy to find a material which rivals the properties and stability of PZT. Currently PZT is still used as a RoHS exemption. Under the circumstances, potassium sodium niobate (KNN) is said to exhibit piezoelectric properties relatively close to that of PZT, and thus it is listed as a lead-free alternative substance to PZT. For example, Japanese Patent Application Publication No. 2014-33210 discloses a piezoelectric body formed from potassium sodium niobate.

Specifically, Japanese Patent Application Publication No. 2014-33210 discloses a piezoelectric body layer expressed by the compositional formula of $(K_aNa_{1-a})_xNbO_3$ ($0.1<a<1$, $1 \leq x \leq 1.2$). Japanese Patent Application Publication No. 2014-33210 describes addition of potassium or sodium excessively or other components as needed. In the production method of this piezoelectric body layer, it describes applying a precursor solution with the composition of the formula on a substrate, annealing and crystallizing the product to form a piezoelectric body, i.e. sol-gel method. It also describes that the piezoelectric body layer may also be formed by the MOD method, the laser abrasion method, or the sputtering method.

Japanese Patent Application Publication Nos. 2017-179415 and 2017-179416 describe production of a piezoelectric thin film of potassium sodium niobite by using a sputtering target. Specifically, Japanese Patent Application Publication Nos. 2017-179415 and 2017-179416 disclose a sputtering target having a perovskite-type oxide represented by $ABO_3$, as its main component, which contains K and Na as component A and contains Nb, Ta or Zr as component B. The sputtering target is formed from a sintered body which is obtained by calcinating a $Na_2CO_3$ powder, a $K_2CO_3$ powder, and a $Nb_2O_5$ powder and thereafter press molding the calcined powders, and burning the molded product in an air atmosphere at 950 to 1350° C.

SUMMARY

As described above, potassium sodium niobate is promising as a lead-free piezoelectric material, and in certain cases trace amounts of an accessory component (dopant) is added to adjust the piezoelectric property thereof. In such a case, a dopant is added to the sputtering target. When a potassium sodium niobate target is prepared by actually adding a dopant, however, a problem that the number of particles with the target would increase during deposition has occurred. In light of this, the embodiment of the present invention provides a sputtering target formed from a potassium sodium niobate sintered body to which a dopant is added, and which is capable of suppressing the generation of particles.

The embodiment of the present invention of solving the problems provides a sputtering target formed from a potassium sodium niobate sintered body to which a dopant is added, wherein one or more types among Li, Mg, Ca, Sr, Ba, Bi, Sb, V, In, Ta, Mo, W, Cr, Ti, Zr, Hf, rare earth elements (Sc, Y, La, Ce, Pr, Nd, Sm, Eu, Gd, Tb, Dy, Ho, Er, Tm, Yb, Lu), Cu, Zn, Ag, Mn, Fe, Co, Ni, Al, Si, Ge, Sn, and Ga are contained as the dopant, and a variation coefficient of a dopant concentration in a plane of the sputtering target is 0.12 or less.

According to the embodiments of the present invention, a sputtering target formed from a potassium sodium niobate sintered body to which a dopant has been added yields a superior effect of suppressing the generation of particles during sputtering deposition.

DETAILED DESCRIPTION

Potassium sodium niobate is a material which exhibits piezoelectric properties relatively close to PZT, which attracts attention as a non-lead-based piezoelectric ceramic material with a small environmental burden. When forming a piezoelectric body film of potassium sodium niobate, a liquid-phase method such as a sol-gel method is known as in Japanese Patent Application Publication No. 2014-33210. Meanwhile, consideration is being made on using such a gas phase method as a sputtering method for forming a piezoelectric body of potassium sodium niobite as in Japanese Patent Application Publication Nos. 2017-179415 and 2017-179416.

The sputtering method is a technique of forming a film having roughly the same composition as the composition ratio of the target by causing Ar ions to collide with a sputtering target and accumulating atoms and molecules, which configure the target, on an opposing substrate. Strict control of film composition ratio and film thickness is possible by using the sputtering method. When this kind of sputtering method is adapted, a potassium sodium niobate sputtering target is required. At the moment, the size of the sputtering target needs to be roughly φ12 inches.

An oxide-based sputtering target such as potassium sodium niobate is normally formed by forming a sintered body by sintering a raw material powder, and then machining the sintered body into a target shape. Nevertheless, potassium sodium niobate is sintering-resistant, i.e. hard to sinter. Thus, in using a sputtering target formed from such a sintered body, there was a problem in that a large number of particles were generated during deposition, in particular, the increase of particles was notable by the addition of a dopant.

After the intense study for the cause of increases in the number of particles when a dopant is added to potassium sodium niobate, it was revealed that the compositional variation in a plane of the target tends to increase when a dopant is added, which caused to increase the number of particles. The present inventors found that such in-plane compositional variation attributed to the hygroscopicity and volatility of the dopant raw material; and by devising the production method, it is possible to cause the composition distribution in a plane of the target to be uniform, and consequently suppress the generation of particles.

The sputtering target according to the embodiment of the present invention is formed from a potassium sodium niobate sintered body to which a dopant is added, wherein one or more types among various elements including Li as a group 1 element, Mg, Ca, Sr, and Ba as group 2 elements, Sc, Y, La, Ce, Pr, Nd, Sm, Eu, Gd, Tb, Dy, Ho, Er, Tm, Yb, and Lu as rare earth elements, Ti, V, Cr, Mn, Fe, Co, Ni, Cu, Zr, Mo, Ag, Hf, Ta, and W as transition metal elements, Al, Zn, Ga, and In as amphoteric metal elements, and Si, Ge, Sn, Sb, and Bi as metalloid elements are added as the dopant. These elements are components which contribute to improving piezoelectric properties.

A type of a dopant to be added and the additive amount can be adjusted according to the desired properties for each application of the piezoelectric body, since piezoelectric properties such as the polarizability, Curie point, relative permittivity, and mechanical quality factor may change by addition of a dopant. Further, by addition of a dopant, supplementary effect such as improvement in sinterability or productivity can be obtained. The total additive amount of the dopants is preferably 0.04 at % or higher and 4 at % or less. Preferably, the content of ratio of niobium (Nb), potassium (K), and sodium (Na) as the main components is, in terms of atomic ratio, Nb:K:Na=1.0:X:1−X (provided that X is 0.3≤X<1.0).

The sputtering target according to the embodiment of the present invention includes that the variation coefficient of the dopant concentration (standard deviation/average value) in a plane of the sputtering target is 0.12 or less, more preferably 0.03 or less. If the dopant concentration distribution in a plane of the sputtering target is within the range, it is possible to sufficiently suppress the generation of particles during deposition. The dopant concentration is obtained by measuring the concentration at 9 in-plane locations of the sputtering target, which is 1 at the center, 4 at ½ radius in 90-degree intervals, and 4 at 3 cm inward from the outer circumference in 90-degree intervals and finding the average value from the obtained concentrations at 9 locations and the variation coefficient of the dopant concentration (standard deviation/average value) from the standard deviation. When more than two types of dopants are used, by measuring all dopant concentrations, the standard deviation and the average value are obtained from the total content thereof.

The sputtering target according to the embodiment of the present invention includes that the variation coefficient of the K/Na composition ratio (standard deviation/average value) in a plane of the sputtering target is preferably 0.12 or less, more preferably 0.03 or less. By controlling the composition ratio distribution in a plane of the sputtering target within the range, it is possible to sufficiently suppress the generation of particles during deposition. The K/Na composition ratio is the atomic ratio of K/Na contained in the sputtering target, and is obtained in the same manner as above, by measuring the contents of K and Na at 9 in-plane locations of the sputtering target, calculating the standard deviation and the average value of the K/Na atomic ratio, and obtaining the variation coefficient of the K/Na composition ratio (standard deviation/average value) from the calculated values.

Note that, for a square sputtering target, it would be sufficient to measure 9 locations such as the center part, outer peripheral part and their halfway points so that there will be no bias in the measured locations.

The sputtering target according to the embodiment of the present invention includes that the relative density being at 60% or higher can sufficiently suppress the generation of particles. Meanwhile, because the discharge during sputtering becomes more stable as the relative density of the sputtering target is higher, it is possible to obtain a high deposition rate. Thus, from the perspective of productivity improvement, the relative density is preferably 70% or higher, 80% or higher, 90% or higher, 95% or higher, and even 98% or higher.

The sputtering target according to the embodiment of the present invention includes that it is possible to sufficiently suppress the generation of particles when its flexural strength is 10 MPa or more. Meanwhile, in the case of high power sputtering for improvement in the deposition rate, there are cases where the target cracks due to the thermal stress caused by the power continuously turned on and off during sputtering. In order to improve resistance against cracks caused by such thermal stress, the flexural strength is preferably 20 MPa or more, 30 MPa or more, 40 MPa or more, 50 MPa or more, and even 55 MPa or more.

The average crystal grain size of the sputtering target according to the embodiment of present invention is preferably 1 μm or more and 20 μm or less. By refining the sputtering target structure, it is possible to realize stable sputtering. Further, a fine structure yields an effect in which cracks and degranulation hardly occur easily during the processing of a sintered body into a sputtering target.

Carbon impurity of gas components contained in the sputtering target according to the embodiment aspect of the present invention is preferably 1000 wtppm or less. By suppressing the content of carbon as a reducing component, it is possible to suppress the composition deviation caused by the simultaneous desorption of oxygen upon the decarburization performed during sintering.

The method of producing the potassium sodium niobate sputtering target according to the embodiments of the present invention is now explained.

Raw Material Powders

A $Nb_2O_5$ powder, a $K_2CO_3$ powder, a $Na_2CO_3$ powder, or a $KNbO_3$ powder, and a $NaNbO_3$ powder are prepared as the raw material powders. As the dopant raw materials, the oxide powders or the carbonate powders of the respective elements of Li, Mg, Ca, Sr, Ba, Bi, Sb, V, In, Ta, Mo, W, Cr, Ti, Zr, Hf, rare earth elements (Sc, Y, La, Ce, Pr, Nd, Sm, Eu, Gd, Tb, Dy, Ho, Er, Tm, Yb, Lu), Cu, Zn, Ag, Mn, Fe, Co, Ni, Al, Si, Ge, Sn, and Ga are prepared. When the average grain size of the raw material powder is large (for instance, $d_{50}$ is approximately 1 mm), pulverization treatment to the respective raw material powders is preferably performed before weighing, since subsequent pulverization based on mixing/pulverization is difficult.

Mixing and Pulverization

The $Nb_2O_5$ powder, the $K_2CO_3$ powder, and the $Na_2CO_3$ powder are weighed to attain the desired composition ratio. The dopant raw materials are weighed according to the content based on the intended usage. Here, certain carbonate raw materials and dopant raw materials have a high hygroscopicity, and, tend to deviate from the composition ratio during weighing due to the change in their state. Thus, it is preferable to sufficiently dewater and dry the powders, and weigh in an inert atmosphere of Ar or $N_2$ as much as possible. After weighed, the powders are mixed. Depending on the dopant, there are cases where the cohesive property of the raw material powder becomes stronger. Note that in order to obtain a dense and uniform sintered body, such a mixer as a ball mill or an attritor need to be used to sufficiently perform hyperfine grinding and uniform mixing.

When performing wet mixing, determine the media amount according to the amount of raw material after weighing, and one medium, or a combination of multiple mediums, having a media diameter of roughly φ0.5 mm to 15 mm is used. As the media material, alumina ($Al_2O_3$) or zirconia ($ZrO_2$) may be used. As the dispersive medium, water or ethanol is used; in the case of water, the entire amount of the mixed slurry should be collected upon removing the same. The mixing duration shall be 5 hours or longer, and the pot is rotated at 60 rpm or faster. When using, as the dopant, particularly oxides as raw materials such as Ta, Mo, W, Cr, Ti, Zr, Hf, and rare earth elements having a high hardness or a high melting point, sufficiently disperse the elements with media having different diameters and by multiple-step mixing/pulverization multiple times and the like. When using these pulverization method, mix and pulverize until the grain size $d_{50}$ (median size) is 100 μm or less. It is important to use a small grain size mixed powder as a raw material powder for sintering in order to obtain a dense sintered body (sputtering target).

Formation of Complex Oxide

When using, as the dopant, oxides or carbonates as raw materials such as Li, Mg, Ca, Sr, Ba, Bi, Sb, V, and In having a high volatility or a low melting point, it is possible to improve the uniform composition of the sintered body and the uniformity of the dopant concentration by performing heat treatment for generating complex oxides of K, Na, Nb and dopants before sintering and using the product as the sintering raw material. Even in cases of adding materials such as Cu, Zn, Ag, Mn, Fe, Co, Ni, Al, Si, Ge, Sn, and Ga which can easily form complex oxides of K, Na, Nb and dopants, it is possible to improve the uniform composition of the sintered body and the uniformity of the dopant concentration by performing heat treatment before sintering and using complex oxides of the above oxides as the sintering raw material.

Sintering

The mixed powder is filled in a graphite mold, and is hot press sintered in an inert gas or vacuum atmosphere at 900° C. or higher and less than 1150° C. The load is set 150 kgf/cm² or more and 400 kgf/cm² or less. If the sintering temperature is less than 900° C., the density of the sintered body cannot be sufficiently increased; while if the sintering temperature is at 1150° C. or higher, it will exceed the liquid phase appearance temperature of potassium niobate and the sintered body will melt. Moreover, if the load is less than 150 kgf/cm², the density of the sintered body cannot be sufficiently increased; while if the load exceeds 400 kgf/cm², the possibility of cracking during sintering will increase. Because hot press sintering is normally performed using a graphite mold in a vacuum or a reducing atmosphere, oxygen deficiency will occur, and the bulk resistance of the sintered body can be caused to a low resistance that is less than 1000 Ω·cm.

Finish Processing

After the ends of the obtained potassium sodium niobate sintered body to which a dopant has been added are cut, the surface is polished and finished to obtain a target shape.

The evaluation method, used in the Examples and Comparative Examples described later in the embodiments of the invention, is as follows:

Composition Ratio, Dopant Concentration Device: SPS3500DD manufactured by SII;

Composition Ratio, Dopant Concentration Method: ICP-OES (Inductively Coupled Plasma Optical Emission Spectrometer);

Relative Density: The relative density (%) (=dimension density/theoretical density×100) is obtained by cutting a sintered body into a prescribed size, measuring the dimension and weight thereof to calculate the dimension density, and dividing the dimension density by the theoretical density of potassium sodium niobite after adding various dopant components. Note that the theoretical density is obtained by calculating the element analysis value of the sintered body (sputtering target). By assuming $KNbO_3$, $NaNbO_3$, and oxides corresponding to various dopant elements are the raw materials, the density obtained by mixing these oxides are converted as the theoretical density from the composition ratio of the elements configuring the sintered body.

Gas Components Device: Gas analyzer manufactured by LECO

Average Crystal Grain Size: The average crystal grain size is obtained by polishing the cut surface of the sintered body based on thermal etching and chemical etching, thereafter observing the structure with an electron microscope (magnification of 1000×), drawing 3 straight lines on the photograph of the structure (entire length L), obtaining the number of crystal grains n which cut across these straight lines, and thereby calculating the average crystal grain size (L/n) (crossover method).

Flexural Strength: The flexural strength is measured based on the three-point bending test (compliant with JIS R1601: 2008) by sampling the sintered body.

EXAMPLES

The embodiment of the present invention is now explained based on the Examples and Comparative Examples. These Examples are merely for facilitating understanding, and are not limited by the Examples at all. That is, the present invention is limited only by the scope of the claims, and includes various modifications other than the embodiments described in the present invention.

Examples 1-17

A $KNbO_3$ powder and a $NaNbO_3$ powder were weighed so that the K:Na ratio after sintering becomes 1:1, and as dopants, a $Li_2CO_3$ powder (Examples 1-5, Examples 14-17), a $SrCO_3$ powder (Examples 6-9), a $Bi_2O_3$ powder (Examples 10-13), and a $Sb_2O_3$ powder (Examples 14-17) were thereafter weighed as per Table 1 to attain a prescribed additive amount.

These powders and an $Al_2O_3$ media having a diameter of 3 mm were filled in a ball mill pot, in which ethanol was introduced as a dispersive medium, and the pot was thereafter rotated at 70 rpm to perform wet mixing for 2 hours; the powders were dried and then sieved with a sieve having an aperture of 100 μm.

Next, these pulverized powders were respectively subject to heat treatment (calcination) at 600° C. (Examples 1-9), 500° C. (Examples 10-13) and 400° C. (Examples 14-17) for 6 hours. The calcined powders were pulverized and thereafter respectively subject to hot press (HP) sintering in a vacuum at a temperature of 900° C. (Examples 1-3, 10-12 and 14-16), 1000° C. (Examples 6-8), 600° C. (Examples 4, 13 and 17), and 850° C. (Examples 5 and 9) with a load of 300 kgf/cm². The obtained sintered body was machined and finished to a sputtering target shape.

Various characteristics of thus obtained sputtering target were measured. The in-plane distribution of the composition ratio and the dopant concentration was 0.12 or less, and a highly uniform composition was obtained. With Examples 1-3, 5-8, 10-12, and 14-16, a high strength was obtained in which the relative density was a high density of 95% or higher, and the flexural strength was 50 MPa or more. With Examples 4, 9, 13 and 17, the relative density was less than 90%, and the flexural strength was less than 50 MPa. The average crystal grain size in all Examples was 20 μm or less and exhibited a fine structure. Note that the carbon impurity content of the raw material powder state before hot press was 1000 wtppm or less in all cases.

By performing RF sputtering using the sputtering target and measuring particles having a diameter of 100 nm or more on the substrate on which the film was deposited, favorable results of $1.0 \times 10^3$ particles or less were obtained in all cases. The results are shown in Table 1. Note that, even in cases where Mg, Ca, Ba, V, and In were used as the dopants and sputtering targets were prepared by using the same method as above, a highly uniform composition was obtained. The relative density, the average crystal grain size, and the flexural strength were also of the same level as those described above. Further, when sputtering was performed in the same manner as above, the generation of particles was suppressed. Even with the sputtering targets having low relative density and low strength in Examples 4, 9, 13 and 17, the number of particles was $1.0 \times 10^3$ or less. This can be considered because the uniform composition contributed to particle suppression since the variation coefficient of the dopant concentration and the K/Na composition ratio was small at 0.03 or less in all cases while the density was low on the one hand.

TABLE 1

| | Additive element Type | Total additive elements | | Wet mixing/ pulverization | Formation of complex oxide | | Sintering temperature |
|---|---|---|---|---|---|---|---|
| | | Mixed composition (mol %) | Analysis value (at %) | | Heat treatment temperature | Type | |
| Example 1 | Li | 0.5 | 0.09 | 1 step | 600° C. | Li—Nb—O | 900° C. |
| Example 2 | Li | 6 | 1.19 | 1 step | 600° C. | Li—Nb—O | 900° C. |
| Example 3 | Li | 18 | 3.58 | 1 step | 600° C. | Li—Nb—O | 900° C. |
| Example 4 | Li | 6 | 1.21 | 1 step | 600° C. | Li—Nb—O | 600° C. |
| Example 5 | Li | 6 | 1.19 | 1 step | 600° C. | Li—Nb—O | 850° C. |
| Example 6 | Sr | 0.3 | 0.06 | 1 step | 600° C. | Sr—Nb—O | 1000° C. |
| Example 7 | Sr | 6 | 1.20 | 1 step | 600° C. | Sr—Nb—O | 1000° C. |
| Example 8 | Sr | 18 | 3.59 | 1 step | 600° C. | Sr—Nb—O | 1000° C. |
| Example 9 | Sr | 6 | 1.20 | 1 step | 600° C. | Sr—Nb—O | 850° C. |
| Example 10 | Bi | 0.5 | 0.10 | 1 step | 500° C. | Bi—Nb—O | 900° C. |
| Example 11 | Bi | 3 | 0.60 | 1 step | 500° C. | Bi—Nb—O | 900° C. |
| Example 12 | Bi | 15 | 3.01 | 1 step | 500° C. | Bi—Nb—O | 900° C. |
| Example 13 | Bi | 3 | 0.61 | 1 step | 500° C. | Bi—Nb—O | 600° C. |
| Example 14 | Li, Sb | 0.6 | 0.11 | 1 step | 400° C. | Li—Sb—O | 900° C. |
| Example 15 | Li, Sb | 8 | 1.54 | 1 step | 400° C. | Li—Sb—O | 900° C. |
| Example 16 | Li, Sb | 15 | 2.97 | 1 step | 400° C. | Li—Sb—O | 900° C. |
| Example 17 | Li, Sb | 8 | 1.55 | 1 step | 400° C. | Li—Sb—O | 600° C. |

| | Relative density % | In-plane composition distribution (variation coefficient = standard deviation/average value) | | Gas components C./wtppm | Average crystal grain size μm | Flexural Strength MPa | Particles Particles/ wafer |
|---|---|---|---|---|---|---|---|
| | | Dopant concentration | K/Na composition ratio | | | | |
| Example 1 | 99.4 | 0.068 | 0.036 | 350 | 10.6 | 58 | $0.41 \times 10^3$ |
| Example 2 | 99.7 | 0.023 | 0.041 | 320 | 8.5 | 62 | $0.38 \times 10^3$ |
| Example 3 | 98.7 | 0.044 | 0.038 | 400 | 7.4 | 68 | $0.56 \times 10^3$ |
| Example 4 | 71.1 | 0.019 | 0.012 | 850 | 2.1 | 20 | $0.96 \times 10^3$ |
| Example 5 | 95.1 | 0.029 | 0.027 | 560 | 5.4 | 44 | $0.67 \times 10^3$ |
| Example 6 | 99.9 | 0.074 | 0.024 | 500 | 13.4 | 52 | $0.29 \times 10^3$ |
| Example 7 | 99.8 | 0.035 | 0.023 | 560 | 12.7 | 58 | $0.47 \times 10^3$ |
| Example 8 | 99.5 | 0.056 | 0.045 | 580 | 11.3 | 57 | $0.78 \times 10^3$ |
| Example 9 | 88.5 | 0.025 | 0.016 | 700 | 9.4 | 35 | $0.88 \times 10^3$ |
| Example 10 | 99.6 | 0.055 | 0.049 | 480 | 12.8 | 55 | $0.36 \times 10^3$ |
| Example 11 | 99.1 | 0.019 | 0.056 | 400 | 13.5 | 53 | $0.62 \times 10^3$ |
| Example 12 | 99.5 | 0.035 | 0.053 | 640 | 15.5 | 52 | $0.88 \times 10^3$ |
| Example 13 | 77.3 | 0.024 | 0.009 | 920 | 2.5 | 18 | $0.97 \times 10^3$ |
| Example 14 | 99.3 | 0.095 | 0.053 | 450 | 10.7 | 50 | $0.69 \times 10^3$ |
| Example 15 | 98.6 | 0.064 | 0.071 | 340 | 5.9 | 51 | $0.75 \times 10^3$ |
| Example 16 | 97.1 | 0.083 | 0.092 | 550 | 6.4 | 51 | $0.93 \times 10^3$ |
| Example 17 | 79 | 0.025 | 0.019 | 860 | 3.3 | 27 | $0.94 \times 10^3$ |

Examples 18-25

A $KNbO_3$ powder and a $NaNbO_3$ powder were weighed so that the K:Na ratio after sintering becomes 1:1, and as the dopants, a $Ti_2O_3$ powder (Examples 18-21), and a $Ta_2O_5$ powder (Examples 22-25) were thereafter weighed as per Table 2 to attain a prescribed additive amount.

These powders and an $Al_2O_3$ media having a diameter of 3 mm were filled in a ball mill pot, in which ethanol was introduced as a dispersive medium, and the pot was thereafter rotated at 70 rpm to perform wet mixing for 2 hours. $Al_2O_3$ having a diameter of 1 mm was additionally filled in a ball mill pot and the pot was rotated at 70 rpm to perform wet mixing/pulverization for 2 hours; the powders were dried and then sieved with a sieve having an aperture of 100 μm.

The thus obtained pulverized powders were respectively subject to hot press (HP) sintering in a vacuum at 1100° C. (Examples 18-20), 1150° C. (Examples 22-24), and 900° C. (Examples 21 and 25), with a load of 300 kgf/cm². The obtained sintered body was machined and finished to a sputtering target shape.

Various characteristics of thus obtained sputtering target were measured. The in-plane distribution of the composition ratio and the dopant concentration was 0.12 or less, and a highly uniform composition was obtained. With Examples 18-20, and 22-24, the relative density was a high density of 95% or higher, and with Examples 21 and 25, the relative density was less than 95%. The flexural strength in all Examples was 50 MPa or more and exhibited a high strength. The average crystal grain size in all Examples was 20 μm or less and exhibited a fine structure. Note that the carbon impurity content of the raw material powder state before hot press was 1000 wtppm or less in all cases.

By performing RF sputtering using the sputtering target and measuring particles having a diameter of 100 nm or more on the substrate on which the film was deposited, favorable results of $1.0×10^3$ particles or less were obtained in all cases. The results are shown in Table 1. Note that, even in cases where Mo, W, Cr, Zr, Hf and rare earth elements were used as the dopants and sputtering targets were prepared by using the same method as above, a highly uniform composition was obtained. The relative density, the average crystal grain size, and the flexural strength were also of the same level as those described above. Further, when sputtering was performed in the same manner as described above, the generation of particles was suppressed. Even with the sputtering targets having low relative density in Examples 21 and 25, the number of particles was $1.0×10^3$ or less. This can be considered because the uniform composition contributed to particle suppression, since the variation coefficient of the dopant concentration and the K/Na composition ratio was small at 0.03 or less in all cases while the density was low on the one hand.

TABLE 2

| | Additive element Type | Total additive elements | | Wet mixing/ pulverization | Formation of complex oxide | | Sintering temperature |
| | | Mixed composition (mol %) | Analysis value (at %) | | Heat treatment temperature | Type | |
|---|---|---|---|---|---|---|---|
| Example 18 | Ti | 0.3 | 0.06 | 2 steps | — | — | 1100° C. |
| Example 19 | Ti | 5 | 1.01 | 2 steps | — | — | 1100° C. |
| Example 20 | Ti | 18 | 3.60 | 2 steps | — | — | 1100° C. |
| Example 21 | Ti | 5 | 1.00 | 2 steps | — | — | 900° C. |
| Example 22 | Ta | 0.2 | 0.04 | 2 steps | — | — | 1150° C. |
| Example 23 | Ta | 5 | 0.99 | 2 steps | — | — | 1150° C. |
| Example 24 | Ta | 15 | 2.98 | 2 steps | — | — | 1150° C. |
| Example 25 | Ta | 5 | 1.01 | 2 steps | — | — | 900° C. |

| | Relative density % | In-plane composition distribution (variation coefficient = standard deviation/average value) | | Gas components C./wtppm | Average crystal grain size μm | Flexural Strength MPa | Particles Particles/ wafer |
| | | Dopant concentration | K/Na composition ratio | | | | |
|---|---|---|---|---|---|---|---|
| Example 18 | 99.5 | 0.083 | 0.021 | 460 | 11.6 | 54 | $0.41 × 10^3$ |
| Example 19 | 98.7 | 0.042 | 0.038 | 700 | 12.5 | 62 | $0.51 × 10^3$ |
| Example 20 | 98.5 | 0.043 | 0.052 | 520 | 6.3 | 79 | $0.75 × 10^3$ |
| Example 21 | 94.4 | 0.028 | 0.007 | 610 | 4.5 | 63 | $0.88 × 10^3$ |
| Example 22 | 99.5 | 0.084 | 0.024 | 560 | 10.6 | 56 | $0.45 × 10^3$ |
| Example 23 | 97.9 | 0.064 | 0.055 | 770 | 9.8 | 70 | $0.65 × 10^3$ |
| Example 24 | 97.2 | 0.058 | 0.049 | 720 | 6.5 | 82 | $0.74 × 10^3$ |
| Example 25 | 93.2 | 0.025 | 0.017 | 750 | 4.8 | 55 | $0.85 × 10^3$ |

Examples 26-33

A $KNbO_3$ powder and a $NaNbO_3$ powder were weighed so that the K:Na ratio after sintering becomes 1:1, and as the dopants, a $Mn_2O_3$ powder (Examples 26-29), and a CuO powder (Examples 30-33) were thereafter weighed as per Table 3 to attain a prescribed additive amount.

These powders and an $Al_2O_3$ media having a diameter of 3 mm were filled in a ball mill pot, in which ethanol was introduced as a dispersive medium, and the pot was thereafter rotated at 70 rpm to perform wet mixing for 2 hours. $Al_2O_3$ having a diameter of 1 mm was additionally filled in a ball mill pot and the pot was rotated at 70 rpm to perform wet mixing/pulverization for 2 hours; the powders were dried and then sieved with a sieve having an aperture of 100 μm.

Next, these pulverized powders were respectively subject to heat treatment (calcination) at 700° C. (Examples 26-29) and 800° C. (Examples 30-33) for 6 hours, and, after pulverizing these calcined powders, they were respectively subject to hot press (HP) sintering in a vacuum at a temperature of 1000° C. (Examples 26-28), 950° C. (Examples 30-32), and 600° C. (Examples 29 and 33), with a load of 300 kgf/cm². The obtained sintered body was machined and finished to a sputtering target shape.

Various characteristics of thus obtained sputtering target were measured. The in-plane distribution of the composition ratio and the dopant concentration was 0.12 or less, and a highly uniform composition was obtained. With Examples 26-28, and 30-32, a high strength was obtained in which the relative density was a high density of 95% or higher, and the flexural strength was 50 MPa or more. With Examples 29 and 33, the relative density was less than 95%, and the flexural strength was less than 50 MPa. The average crystal grain size in all Examples was 20 μm or less and exhibited a fine structure. Note that the carbon impurity content of the raw material powder state before hot press was 1000 wtppm or less in all cases.

By performing RF sputtering using the sputtering target and measuring particles having a diameter of 100 nm or more on the substrate on which the film was deposited, favorable results of $1.0\times10^3$ or less were obtained in all cases. The results are shown in Table 1. Even in cases where Zn, Ag, Fe, Co, Ni, Si, Sn, and Ga were used as the dopants and sputtering targets were prepared by using the same method as above, a highly uniform composition was obtained. The relative density, the average crystal grain size, and the flexural strength were also of the same level as those described above. Further, when sputtering was performed in the same manner as described above, the generation of particles was suppressed. Even with the sputtering targets having low relative density and low strength described in Examples 29 and 33, the number of particles was $1.0\times10^3$ or less. This can be considered because the uniform composition contributed to particle suppression, since the variation coefficient of the dopant concentration and the K/Na composition ratio was small at 0.03 or less in all cases while the density was low on the one hand.

Examples 34-41

A KNbO$_3$ powder and a NaNbO$_3$ powder were weighed so that the K:Na ratio after sintering becomes 1:1, and as the dopants, in Examples 34-37 a CaCO$_3$ powder, a Ti$_2$O$_3$ powder, and a CuO powder, and in Examples 38-41 a Li$_2$CO$_3$ powder, a Sb$_2$O$_3$ powder, a Ta$_2$O$_5$ powder, and a Mn$_2$O$_3$ powder were thereafter weighed as per Table 4 to attain a prescribed additive amount.

These powders and an Al$_2$O$_3$ media having a diameter of 3 mm were filled in a ball mill pot, in which ethanol was introduced as a dispersive medium, and the pot was thereafter rotated at 70 rpm to perform wet mixing for 2 hours. Al$_2$O$_3$ having a diameter of 1 mm was additionally filled in a ball mill pot and the pot was rotated at 70 rpm to perform wet mixing/pulverization for 2 hours; the powders were dried and then sieved with a sieve having an aperture of 100 μm.

Next, the pulverized powders were respectively subject to heat treatment (calcination) at 600° C. (Examples 34-37) and 400° C. (Examples 38-41) for 6 hours, and, after pulverizing these calcined powders, they were respectively subject to hot press (HP) sintering in a vacuum at the a temperature of 950° C. (Examples 34-36), 900° C. (Examples 38-40), and 600° C. (Examples 37 and 41), with a load of 300 kgf/cm². The obtained sintered body was machined and finished to a sputtering target shape.

Various characteristics of thus obtained sputtering target were measured. The in-plane distribution of the composition ratio and the dopant concentration was 0.12 or less, and a highly uniform composition was obtained. With Examples 34-36, and 38-40, a high strength was obtained in which the relative density was a high density of 95% or higher, and the flexural strength was 50 MPa or more. With Examples 37 and 41, the relative density was less than 95%, and the

TABLE 3

|  | Additive element Type | Total additive elements | | Formation of complex oxide | | Sintering temperature |
|---|---|---|---|---|---|---|
|  |  | Mixed composition (mol %) | Analysis value (at %) | Wet mixing/ pulverization | Heat treatment temperature | Type |  |
| Example 26 | Mn | 0.5 | 0.10 | 2 steps | 700° C. | K—Mn—O | 1000° C. |
| Example 27 | Mn | 3 | 0.59 | 2 steps | 700° C. | K—Mn—O | 1000° C. |
| Example 28 | Mn | 15 | 3.04 | 2 steps | 700° C. | K—Mn—O | 1000° C. |
| Example 29 | Mn | 3 | 0.60 | 2 steps | 700° C. | K—Mn—O | 600° C. |
| Example 30 | Cu | 0.6 | 0.12 | 2 steps | 800° C. | K—Cu—O | 950° C. |
| Example 31 | Cu | 5 | 1.01 | 2 steps | 800° C. | K—Cu—O | 950° C. |
| Example 32 | Cu | 18 | 3.61 | 2 steps | 800° C. | K—Cu—O | 950° C. |
| Example 33 | Cu | 5 | 1.00 | 2 steps | 800° C. | K—Cu—O | 600° C. |

|  | Relative density % | In-plane composition distribution (variation coefficient = standard deviation/average value) | | Gas components C./wtppm | Average crystal grain size μm | Flexural Strength MPa | Particles Particles/ wafer |
|---|---|---|---|---|---|---|---|
|  |  | Dopant concentration | K/Na composition ratio |  |  |  |  |
| Example 26 | 99.4 | 0.091 | 0.033 | 380 | 10.1 | 54 | 0.40 × 10^3 |
| Example 27 | 99.6 | 0.056 | 0.078 | 620 | 8.7 | 58 | 0.43 × 10^3 |
| Example 28 | 97.5 | 0.064 | 0.069 | 700 | 7.5 | 55 | 0.66 × 10^3 |
| Example 29 | 70.5 | 0.023 | 0.015 | 960 | 2.1 | 19 | 0.93 × 10^3 |
| Example 30 | 99.3 | 0.069 | 0.037 | 520 | 9.8 | 56 | 0.42 × 10^3 |
| Example 31 | 98.9 | 0.055 | 0.068 | 510 | 7.2 | 55 | 0.56 × 10^3 |
| Example 32 | 98 | 0.058 | 0.065 | 640 | 6.4 | 64 | 0.67 × 10^3 |
| Example 33 | 69.3 | 0.021 | 0.008 | 900 | 1.7 | 11 | 0.98 × 10^3 | flexural strength was less than 50 MPa. The average crystal grain size in all Examples was 20 µm or less and exhibited a fine structure. Note that the carbon impurity content of the raw material powder state before hot press was 1000 wtppm or less in all cases.

By performing RF sputtering using the sputtering target and measuring particles having a diameter of 100 nm or more on the substrate on which the film was deposited, favorable results of $1.0 \times 10^3$ particles or less were obtained in all cases. Even with the sputtering targets having low relative density and low strength in Examples 37 and 41, the number of particles was $1.0 \times 10^3$ or less. This can be considered because the uniform composition contributed to particle suppression, since the variation coefficient of the dopant concentration and the K/Na composition ratio was small at 0.03 or less in all cases while the density was low on the one hand.

The thus obtained pulverized powder was subject to hot press (HP) sintering in a vacuum at 900° C., with a load of 300 kgf/cm$^2$. The obtained sintered body was machined and finished to a sputtering target shape.

Various characteristics of thus obtained sputtering target were measured. The in-plane distribution of the composition ratio and the dopant concentration was 0.156, and a low uniform composition was obtained. Though shown in the tables, the carbon impurity content of the raw material powder state before hot press was 1250 wtppm. This high carbon impurity content is considered because while Li carbonate was used as the raw material on the one hand, carbon components remained since heat treatment for forming a complex oxide was not performed.

Next, by performing RF sputtering using the sputtering target and measuring particles having a diameter of 100 nm

TABLE 4

| | Additive element Type | Total additive elements | | Wet mixing/ pulverization | Formation of complex oxide | | Sintering temperature |
|---|---|---|---|---|---|---|---|
| | | Mixed composition (mol %) | Analysis value (at %) | | Heat treatment temperature | Type | |
| Example 34 | Ca, Ti, Cu | 0.8 | 0.15 | 2 steps | 600° C. | Ca—Ti—O, K—Cu—O | 950° C. |
| Example 35 | Ca, Ti, Cu | 8 | 1.60 | 2 steps | 600° C. | Ca—Ti—O, K—Cu—O | 950° C. |
| Example 36 | Ca, Ti, Cu | 18 | 3.66 | 2 steps | 600° C. | Ca—Ti—O, K—Cu—O | 950° C. |
| Example 37 | Ca, Ti, Cu | 8 | 1.63 | 2 steps | 600° C. | Ca—Ti—O, K—Cu—O | 600° C. |
| Example 38 | Li, Sb, Ta, Mn | 0.8 | 0.16 | 2 steps | 400° C. | Li—Sb—O, K—Mn—O | 900° C. |
| Example 39 | Li, Sb, Ta, Mn | 10 | 1.97 | 2 steps | 400° C. | Li—Sb—O, K—Mn—O | 900° C. |
| Example 40 | Li, Sb, Ta, Mn | 18 | 3.62 | 2 steps | 400° C. | Li—Sb—O, K—Mn—O | 900° C. |
| Example 41 | Li, Sb, Ta, Mn | 10 | 2.02 | 2 steps | 400° C. | Li—Sb—O, K—Mn—O | 600° C. |

| | Relative density % | In-plane composition distribution (variation coefficient = standard deviation/average value) | | Gas components C./wtppm | Average crystal grain size µm | Flexural Strength MPa | Particles Particles/ wafer |
|---|---|---|---|---|---|---|---|
| | | Dopant concentration | K/Na composition ratio | | | | |
| Example 34 | 99.1 | 0.056 | 0.07 | 500 | 11.8 | 59 | 0.49 × 10^3 |
| Example 35 | 98.3 | 0.042 | 0.073 | 830 | 9.5 | 65 | 0.58 × 10^3 |
| Example 36 | 96.4 | 0.083 | 0.077 | 880 | 8 | 76 | 0.75 × 10^3 |
| Example 37 | 77 | 0.016 | 0.012 | 940 | 2.4 | 20 | 0.96 × 10^3 |
| Example 38 | 99.3 | 0.056 | 0.066 | 870 | 7.2 | 53 | 0.76 × 10^3 |
| Example 39 | 98.3 | 0.071 | 0.065 | 890 | 4.8 | 55 | 0.74 × 10^3 |
| Example 40 | 97.8 | 0.011 | 0.093 | 940 | 4.5 | 56 | 0.94 × 10^3 |
| Example 41 | 79.5 | 0.023 | 0.015 | 910 | 3.3 | 29 | 0.97 × 10^3 |

Comparative Example 1

A KNbO$_3$ powder and a NaNbO$_3$ powder were weighed so that the K:Na ratio after sintering becomes 1:1, and a Li$_2$CO$_3$ powder as the dopant was thereafter weighed to attain a prescribed additive amount.

These powders and an Al$_2$O$_3$ media having a diameter of 3 mm were filled in a ball mill pot, in which ethanol was introduced as a dispersive medium, and the pot was thereafter rotated at 70 rpm to perform wet mixing for 2 hours; the powders were dried and then sieved with a sieve having an aperture of 100 µm.

or more on the substrate on which the film was deposited, the particles generated were high at $1.21 \times 10^3$.

Comparative Example 2

A KNbO$_3$ powder and a NaNbO$_3$ powder were weighed so that the K:Na ratio after sintering becomes 1:1, and a Li$_2$CO$_3$ powder as the additive element was thereafter weighed to attain a prescribed additive amount.

These powders and an Al$_2$O$_3$ media having a diameter of 3 mm were filled in a ball mill pot, in which ethanol was introduced as a dispersive medium, and the pot was thereafter rotated at 70 rpm to perform wet mixing/pulverization for 2 hours; the powders were dried and then sieved with a sieve having an aperture of 100 μm.

Comparative Example 3

A $KNbO_3$ powder and a $NaNO_3$ powder were weighed so that the K:Na ratio after sintering becomes 1:1, and as the dopants, a $Li_2CO_3$ powder was thereafter weighed as per Table 5 to attain a prescribed additive amount.

These powders and an $Al_2O_3$ media having a diameter of 3 mm were filled in a ball mill pot, in which ethanol was introduced as a dispersive medium, and the pot was thereafter rotated at 70 rpm to perform wet mixing for 2 hours. The powders were dried and then sieved with a sieve having an aperture of 100 μm. Next, the pulverized powder was subject to heat treatment (calcination) at 600° C., and, after pulverizing this calcined powder, it was subject to hot press (HP) sintering in a vacuum at a temperature of 900° C. with a load of 300 kgf/cm².

Various characteristics of thus obtained sputtering target were measured. The in-plane distribution of the K/Na composition ratio was 0.174. The relative density was 94.6%.

Next, by performing RF sputtering using the sputtering target and measuring particles having a diameter of 100 nm or more on the substrate on which the film was deposited, the particles generated were high at $1.71 \times 10^3$.

Next, the thus obtained pulverized powder was subject to heat treatment (calcination) at 600° C. for 6 hours, and, after pulverizing this calcined powder, it was subject to hot press (HP) sintering in a vacuum at a sintering temperature at 1200° C. with a load of 300 kgf/cm². Since the sintered body had consequently melted, it was not processed into a sputtering target shape.

Comparative Example 4

A $KNbO_3$ powder and a $NaNbO_3$ powder were weighed so that the K:Na ratio after sintering becomes 1:1, and a $Ta_2O_5$ powder as the additive element was thereafter weighed to attain a prescribed additive amount.

These powders and an $Al_2O_3$ media having a diameter of 3 mm were filled in a ball mill pot, in which ethanol was introduced as a dispersive medium, and the pot was thereafter rotated at 70 rpm to perform wet mixing/pulverization for 2 hours; the powders were dried and then sieved with a sieve having an aperture of 100 μm.

After pulverizing this dried powder, it was subject to hot press (HP) sintering in a vacuum at a sintering temperature at 1150° C. with a load of 300 kgf/cm².

Various characteristics of thus obtained sputtering target were measured. The in-plane distribution of the K/Na composition ratio was 0.132. The relative density was 94.5%.

Next, by performing RF sputtering using the sputtering target and measuring particles having a diameter of 100 nm or more on the substrate on which the film was deposited, the particles generated were high at $1.63 \times 10^3$.

Comparative Example 5

A $KNbO_3$ powder and a $NaNbO_3$ powder were weighed so that the K:Na ratio after sintering becomes 1:1, and a $Mn_2O_3$ powder as the additive element was thereafter weighed to attain a prescribed additive amount.

These powders and an $Al_2O_3$ media having a diameter of 3 mm were filled in a ball mill pot, in which ethanol was introduced as a dispersive medium, and the pot was thereafter rotated at 70 rpm to perform wet mixing/pulverization for 2 hours. $Al_2O_3$ having a diameter of 1 mm was additionally filled in a ball mill pot and the pot was rotated at 70 rpm to perform wet mixing/pulverization for 2 hours; the powders were dried and then sieved with a sieve having an aperture of 100 μm.

The pulverized powder was dried and subject to hot press sintering in a vacuum at 1000° C., with a load of 300 kgf/cm². Various characteristics of thus obtained sputtering target were measured. The in-plane distribution of the dopant concentration was 0.128.

Next, by performing RF sputtering using the sputtering target and measuring particles having a diameter of 100 nm or more on the substrate on which the film was deposited, the particles generated were high at $1.31 \times 10^3$.

Comparative Example 6

A $KNbO_3$ powder and a $NaNbO_3$ powder were weighed so that the K:Na ratio after sintering becomes 1:1, and a CuO powder as the additive element was thereafter weighed to attain a prescribed additive amount.

These powders and an $Al_2O_3$ media having a diameter of 3 mm were filled in a ball mill pot, in which ethanol was introduced as a dispersive medium, and the pot was thereafter rotated at 70 rpm to perform wet mixing/pulverization for 2 hours. $Al_2O_3$ having a diameter of 1 mm was additionally filled in a ball mill pot and the pot was rotated at 70 rpm to perform wet mixing/pulverization for 2 hours; the powders were then dried and sieved with a sieve having an aperture of 100 μm.

The pulverized powder was dried and subject to hot press sintering in a vacuum at 950° C., with a load of 300 kgf/cm².

Various characteristics of thus obtained sputtering target were measured. The in-plane distribution of the dopant concentration was 0.142, and the in-plane distribution of the K/Na composition ratio was 0.13. The relative density was 93.5%.

By performing RF sputtering using the sputtering target and measuring particles having a diameter of 100 nm or more on the substrate on which the film was deposited, the particles generated were high at $2.1 \times 10^3$.

TABLE 5

| | Additive element Type | Total additive elements | | Formation of complex oxide | | | |
| --- | --- | --- | --- | --- | --- | --- | --- |
| | | Mixed composition (mol %) | Analysis value (at %) | Wet mixing/ pulverization | Heat treatment temperature | Type | Sintering temperature |
| Comparative Example 1 | Li | 6 | 1.15 | 1 step | — | — | 900° C. |
| Comparative Example 2 | Li | 6 | 1.04 | 1 step | 600° C. | Li—Nb—O | 1200° C. |

TABLE 5-continued

| | | | | | | | |
|---|---|---|---|---|---|---|---|
| Comparative Example 3 | Li | 25 | 5.03 | 1 step | 600° C. | Li—Nb—O | 900° C. |
| Comparative Example 4 | Ta | 5 | 1.00 | 1 step | — | — | 1150° C. |
| Comparative Example 5 | Mn | 3 | 0.59 | 2 steps | — | — | 1000° C. |
| Comparative Example 6 | Cu | 21 | 4.22 | 2 steps | — | — | 900° C. |

| | | In-plane composition distribution (variation coefficient = standard deviation/average value) | | | Average | | |
|---|---|---|---|---|---|---|---|
| | Relative density % | Dopant concentration | K/Na composition ratio | Gas components C./wtppm | crystal grain size μm | Flexural Strength MPa | Particles Particles/ wafer |
| Comparative Example 1 | 99.1 | 0.156 | 0.081 | 1250 | 9.8 | 51 | 1.21 × 10^3 |
| Comparative Example 2 | Melted | 0.212 | 0.122 | 550 | Unmeasurable due to melting | Unable to obtain sample | Unable to prepare target |
| Comparative Example 3 | 94.6 | 0.084 | 0.174 | 920 | 5.6 | 47 | 1.71 × 10^3 |
| Comparative Example 4 | 94.5 | 0.076 | 0.132 | 680 | 5.4 | 38 | 1.63 × 10^3 |
| Comparative Example 5 | 97.8 | 0.128 | 0.095 | 620 | 6.5 | 52 | 1.31 × 10^3 |
| Comparative Example 6 | 93.5 | 0.142 | 0.13 | 750 | 4.6 | 44 | 2.10 × 10^3 |

The sputtering target according to the embodiment of the present invention is formed from a potassium sodium niobate sintered body to which a dopant has been added, and a variation coefficient of a dopant concentration (standard deviation/average value) in a plane of the sputtering target is 0.12 or less. Sputtering this kind of target may be suitably used to perform deposition in which the generation of particles is suppressed. Because it is known that potassium sodium niobate (KNN) exhibits piezoelectric properties that are relatively close to that of PZT, it is useful as a piezoelectric element such as a lead-free actuator or sensor as a substitute of PZT.

We claim:

1. A sputtering target formed from a potassium sodium niobate sintered body to which a dopant has been added, wherein the dopant contained is one or more types among Li, Mg, Ca, Sr, Ba, Bi, Sb, V, In, Ta, Mo, W, Cr, Ti, Zr, Hf, Sc, Y, La, Ce, Pr, Nd, Sm, Eu, Gd, Tb, Dy, Ho, Er, Tm, Yb, Lu, Cu, Zn, Ag, Mn, Fe, Co, Ni, Al, Si, Ge, Sn, and Ga; and wherein a variation coefficient of a dopant concentration in a plane of the sputtering target is 0.12 or less.

2. The sputtering target according to claim 1, wherein a variation coefficient of a K/Na composition ratio in a plane of the sputtering target is 0.12 or less.

3. The sputtering target according to claim 2, wherein a relative density is 60% or higher.

4. The sputtering target according to claim 2, wherein a relative density is 70% or higher.

5. The sputtering target according to claim 2, wherein a relative density is 80% or higher.

6. The sputtering target according to claim 5, wherein a flexural strength is 10 MPa or more.

7. The sputtering target according to claim 6, wherein an average crystal grain size is 1 to 20 μm.

8. The sputtering target according to claim 7, wherein a content of carbon as a gas component is 1000 wtppm or less.

9. The sputtering target according to claim 8, wherein a content ratio of niobium (Nb), potassium (K), and sodium (Na) is, in terms of atomic ratio, Nb:K:Na=1.0:X:1−X, where 0.3≤X<1.0.

10. The sputtering target according to claim 9, wherein a total content of the dopant is 0.04 at % to 4 at %.

11. The sputtering target according to claim 1, wherein a relative density is 60% or higher.

12. The sputtering target according to claim 1, wherein a relative density is 70% or higher.

13. The sputtering target according to claim 1, wherein a relative density is 80% or higher.

14. The sputtering target according to claim 1, wherein a flexural strength is 10 MPa or more.

15. The sputtering target according to claim 1, wherein an average crystal grain size is 1 to 20 μm.

16. The sputtering target according to claim 1, wherein a content of carbon as a gas component is 1000 wtppm or less.

17. The sputtering target according to claim 1, wherein a content ratio of niobium (Nb), potassium (K), and sodium (Na) is, in terms of atomic ratio, Nb:K:Na=1.0:X:1−X, where 0.3≤X<1.0.

18. The sputtering target according to claim 1, wherein a total content of the dopant is 0.04 at % to 4 at %.

* * * * *